United States Patent
Wu et al.

(10) Patent No.: US 12,057,843 B2
(45) Date of Patent: Aug. 6, 2024

(54) PULSE-WIDTH MODULATION CIRCUIT

(71) Applicant: Prilit Optronics, Inc., Tainan (TW)

(72) Inventors: Biing-Seng Wu, Tainan (TW);
Tzung-Ren Wang, Tainan (TW);
Han-Shui Hsueh, Tainan (TW)

(73) Assignee: Prilit Optronics, Inc., Tainan (TW)

( * ) Notice: Subject to any disclaimer, the term of this patent is extended or adjusted under 35 U.S.C. 154(b) by 0 days.

(21) Appl. No.: 18/131,766

(22) Filed: Apr. 6, 2023

(65) Prior Publication Data

US 2023/0327654 A1   Oct. 12, 2023

Related U.S. Application Data

(60) Provisional application No. 63/329,588, filed on Apr. 11, 2022.

(51) Int. Cl.
*H03K 5/133* (2014.01)
*H03K 5/156* (2006.01)
*H03K 7/08* (2006.01)

(52) U.S. Cl.
CPC .......... *H03K 5/133* (2013.01); *H03K 5/1565* (2013.01); *H03K 7/08* (2013.01)

(58) Field of Classification Search
None
See application file for complete search history.

(56) References Cited

U.S. PATENT DOCUMENTS

| | | | | |
|---|---|---|---|---|
| 7,459,951 B2* | 12/2008 | Prodic | ............ | H03K 7/08 327/175 |
| 7,893,744 B2* | 2/2011 | Nakamura | ......... | H03K 5/00006 327/175 |

* cited by examiner

*Primary Examiner* — Cassandra F Cox
(74) *Attorney, Agent, or Firm* — Donald E. Stout; Stout, Uxa & Buyan, LLP

(57) ABSTRACT

A pulse-width modulation (PWM) circuit includes a partition circuit coupled to receive a PWM value representing a duty cycle of a PWM signal to be generated, and configured to accordingly generate a most-significant-bits (MSB) value representing higher-order bits of the PWM value and a least-significant-bits (LSB) value representing lower-order bits of the PWM value; a PWM generator coupled to receive the MSB value or a derivative thereof, and configured to accordingly generate a primary signal with a duty cycle corresponding to the MSB value; a delay circuit that generates a delay signal representing the primary signal with delay time determined according to the LSB value or a derivative thereof; and a combine circuit that generates the PWM signal according to the primary signal and the delay signal, by performing a logical operation on the primary signal and the delay signal.

10 Claims, 3 Drawing Sheets

PULSE-WIDTH MODULATION CIRCUIT

CROSS-REFERENCE TO RELATED APPLICATIONS

This application claims the benefit of U.S. Provisional Application No. 63/329,588, filed on Apr. 11, 2022, the entire contents of which are herein incorporated by reference.

BACKGROUND OF THE INVENTION

1. Field of the Invention

The present invention generally relates to a pulse-width modulation (PWM) circuit, and more particularly to a low-frequency high color resolution PWM circuit.

2. Description of Related Art

Pulse-width modulation (PWM) is a modulation technique that generates variable-width pulses to represent the amplitude of an analog input signal or its equivalent digital value. PWM may be adapted to many applications, such as telecommunication, power delivery and voltage regulation.

However, as the color resolution of a PWM circuit increases, high-frequency clock is required to operate the PWM circuit. For example, in the application of the PWM circuit adapting to the driver of a high color resolution micro-light-emitting diode (microLED) display panel, it is difficult to pass the high-frequency clock to the driver through glass, and to implement the driver with high-frequency clock. Moreover, high-frequency PWM circuit may commonly incur electromagnetic interference (EMI).

A need has thus arisen to propose a novel scheme to overcome drawbacks of the conventional PWM circuit.

SUMMARY OF THE INVENTION

In view of the foregoing, it is an object of the embodiment of the present invention to provide a high color resolution pulse-width modulation (PWM) circuit operable with low-frequency clock.

According to one embodiment, a pulse-width modulation (PWM) circuit includes a partition circuit, a PWM generator, a delay circuit and a combine circuit. The partition circuit is coupled to receive a PWM value representing a duty cycle of a PWM signal to be generated, and configured to accordingly generate a most-significant-bits (MSB) value representing higher-order bits of the PWM value and a least-significant-bits (LSB) value representing lower-order bits of the PWM value. The PWM generator is coupled to receive the MSB value or a derivative thereof, and configured to accordingly generate a primary signal with a duty cycle corresponding to the MSB value. The delay circuit generates a delay signal representing the primary signal with delay time determined according to the LSB value or a derivative thereof. The combine circuit generates the PWM signal according to the primary signal and the delay signal, by performing a logical operation on the primary signal and the delay signal.

DETAILED DESCRIPTION OF THE INVENTION

Figure 1:
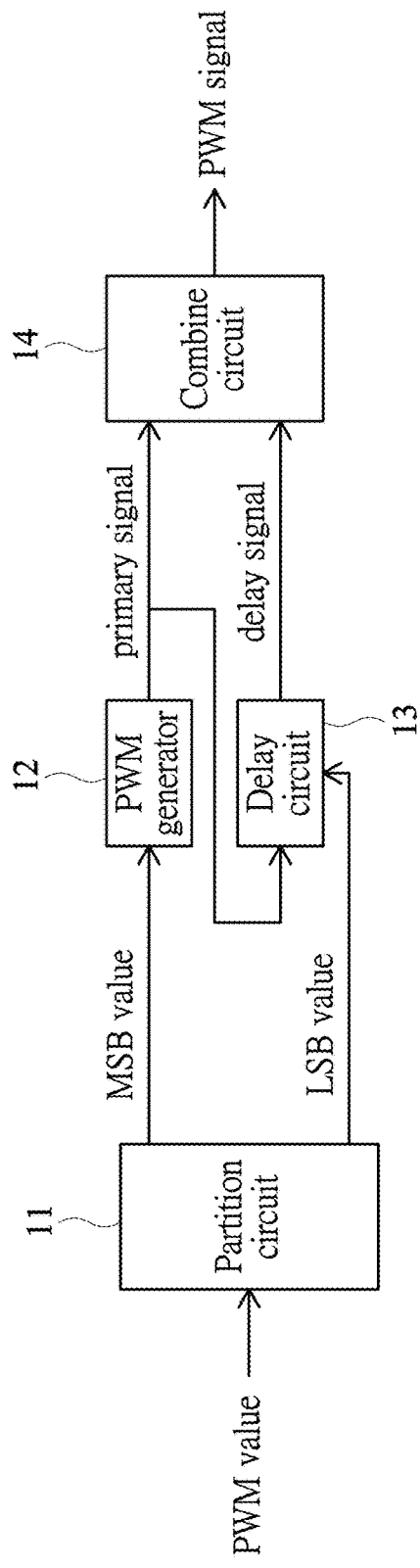
FIG. 1 shows a block diagram illustrating a pulse-width modulation (PWM) circuit according to one embodiment of the present invention.

FIG. 1 shows a block diagram illustrating a pulse-width modulation (PWM) circuit 100 according to one embodiment of the present invention. The PWM circuit 100 may be adaptable to, but not limited to, a driver of a display panel, such as a display driver integrated circuit (DDIC) of a micro-light-emitting diode (microLED) display panel.

In the embodiment, the PWM circuit 100 may include a partition circuit 11 coupled to receive a PWM value representing a duty cycle (i.e., proportion of on time to a period time) of a PWM signal to be generated, and configured to accordingly generate a most-significant-bits (MSB) value representing higher-order bits of the (binary) PWM value, and a least-significant-bits (LSB) value representing lower-order bits of the PWM value. In one embodiment, for example, the partition circuit 11 partitions a 17-bit PWM value to generate a MSB value representing ten highest-order bits of the PWM value, and a LSB value representing seven lowest-order bits of the PWM value, that is, PWM[16:0]=MSB[16:7]+LSB[6:0]. It is appreciated that the PWM value may be partitioned in other ways or the total bits of the PWM value may be other than 17 bits. For example, PWM[16:0]=MSB[16:6]+LSB[5:0] or PWM[15:0]=MSB[15:8]+LSB[7:0]. Although the PWM value is partitioned into two values (i.e., MSB value and LSB value) in the embodiment, it is appreciated that the PWM value may generally be partitioned by the partition circuit 11 into more than two values.

The PWM circuit 100 of the embodiment may include a PWM generator 12 coupled to receive the MSB value or a derivative thereof, and configured to accordingly generate a primary signal with a duty cycle corresponding to the MSB value.

Figure 2:
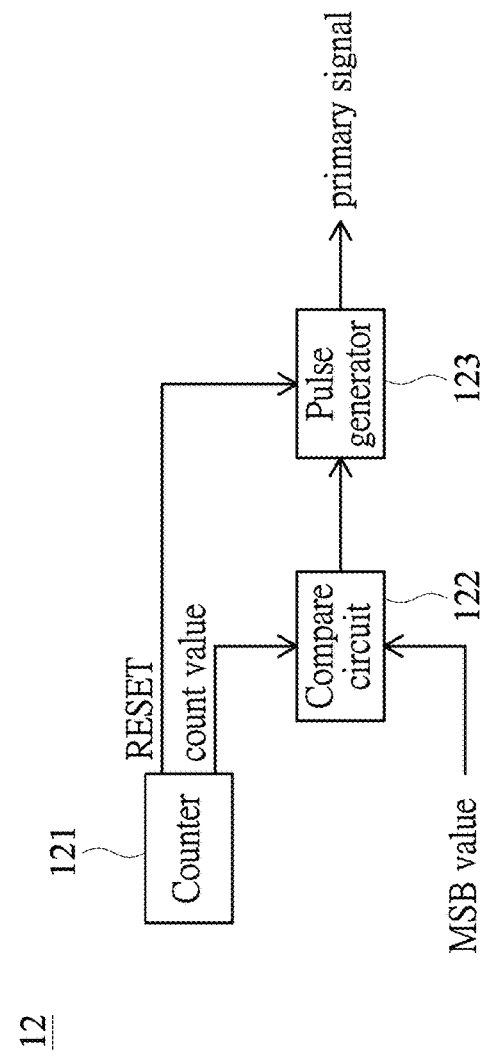
FIG. 2 shows a block diagram illustrating the PWM generator of FIG. 1.

FIG. 2 shows a block diagram illustrating the PWM generator 12 of FIG. 1. Specifically, the PWM generator 12 may include a counter 121 that increments periodically. The PWM generator 12 may include a compare circuit 122 configured to compare a count value of the counter 12 with the MSB value. The PWM generator 12 may include a pulse generator 123 that generates a pulse when the counter 12 starts counting (responding to a reset signal RESET). The generated pulse is held high until the count value (of the counter 12) is greater than the MSB value, thereby generating the primary signal. It is noted that, as the MSB value has fewer bits than the PWM value, the counter 121 (of the PWM generator 12) may be operated by a low-frequency clock.

Referring back to FIG. 1, the PWM circuit 100 of the embodiment may include a delay circuit 13 configured to generate a delay signal representing the primary signal with delay time determined according to the LSB value or a derivative thereof.

Figure 3A:
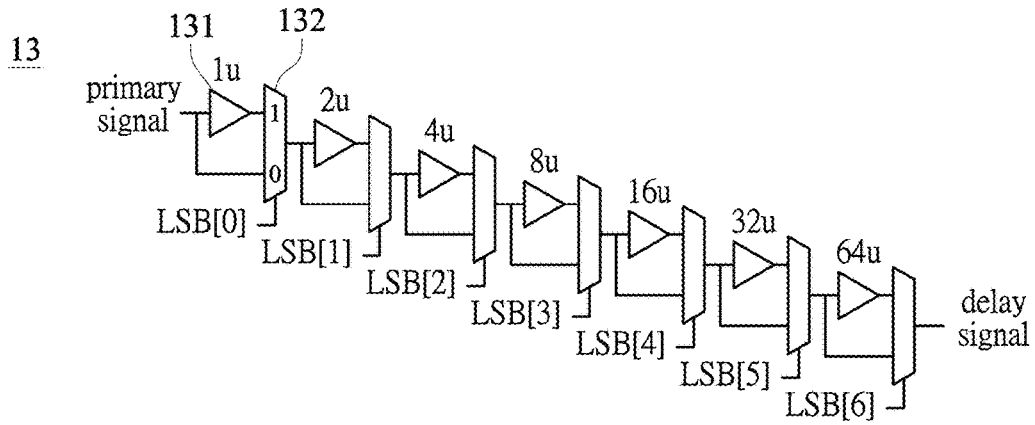
FIG. 3A shows a detailed circuit exemplifying the delay circuit of FIG. 1.

FIG. 3A shows a detailed circuit exemplifying the delay circuit 13 of FIG. 1. Specifically, the delay circuit 13 may include a plurality of delay gates 131 with different delay units connected in series. One of an input and an output of each delay gate 131 is selected by a corresponding multiplexer 132 according to a corresponding LSB bit. In this example, the output of the delay gate 131 is selected when the corresponding LSB bit is "1," otherwise the input of the delay gate 131 is selected.

Figure 3B:
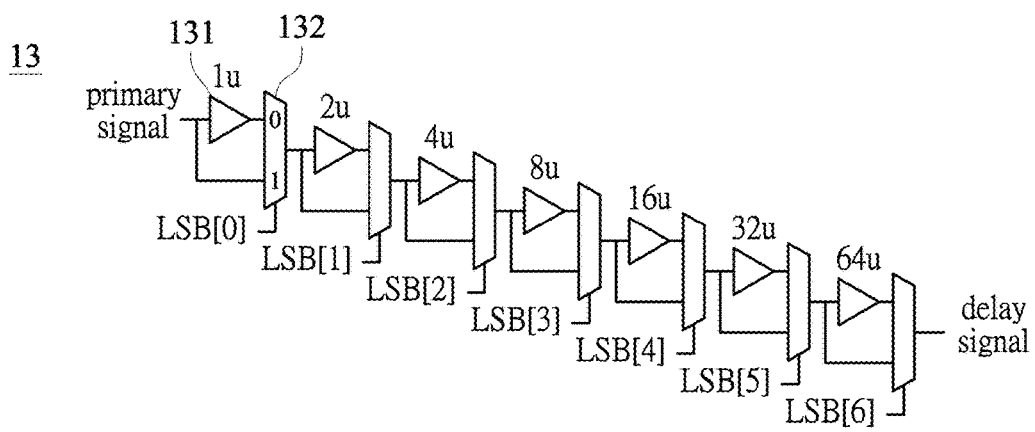
FIG. 3B shows another detailed circuit exemplifying the delay circuit of FIG. 1.

FIG. 3B shows another detailed circuit exemplifying the delay circuit 13 of FIG. 1. The delay circuit 13 of FIG. 3B is similar to the delay circuit 13 of FIG. 3A with the following exceptions. In this example, the input of the delay gate 131 is selected when the corresponding LSB bit is "1," otherwise the output of the delay gate 131 is selected.

Figure 3C:
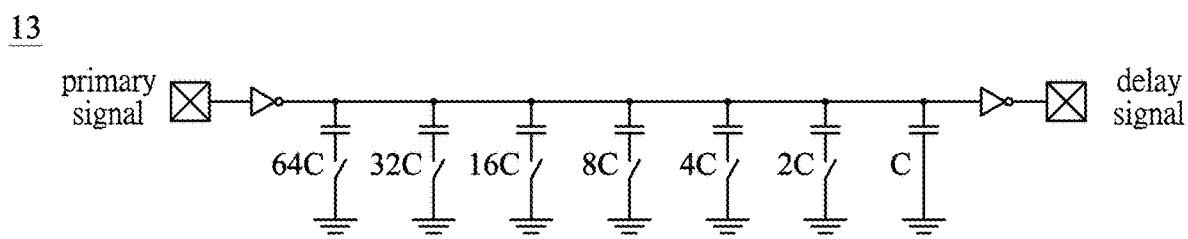
FIG. 3C shows a further detailed circuit exemplifying the delay circuit of FIG. 1.

FIG. 3C shows a further detailed circuit exemplifying the delay circuit 13 of FIG. 1. Specifically, the delay circuit 13 may include a plurality of capacitors with different capacitance connected in parallel, which are controllably connected to earth respectively.

Referring back to FIG. 1, the PWM circuit 100 of the embodiment may include a combine circuit 14 configured to generate the PWM signal (associated with the PWM value) according to the primary signal and the delay signal, by performing a logical operation on the primary signal and the delay signal. Therefore, the PWM signal with high resolution (e.g., 17 bits in the embodiment) may be generated with a low-frequency clock for (the counter 121 of) the PWM generator 12 and with low gate counts (or cost), as compared to a conventional PWM generator that directly operates on the 17-bit PWM signal and hence requires a high-frequency clock for the counter.

Figure 4A:
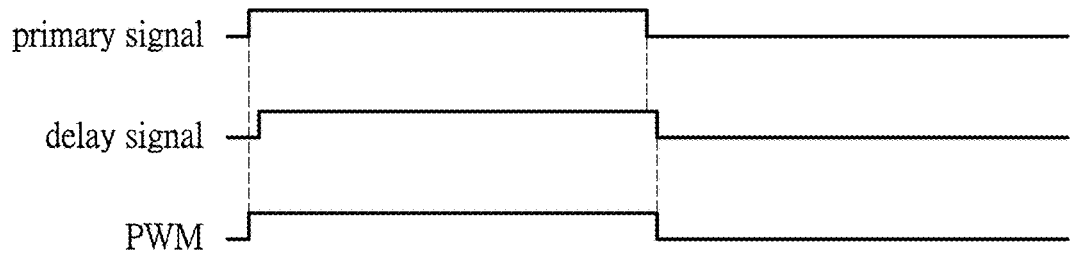
FIG. 4A shows exemplary waveforms of the primary signal, the delay signal and the PWM signal according to a first exemplary embodiment of the present invention.

FIG. 4A shows exemplary waveforms of the primary signal, the delay signal and the PWM signal according to a first exemplary embodiment of the present invention. In the embodiment, logical OR operation is performed on the primary signal (with the MSB value) and the delay signal (with the LSB value). Therefore, the PWM signal turns on at a leading edge of the primary signal, and turns off at a trailing edge of the delay signal.

Figure 4B:
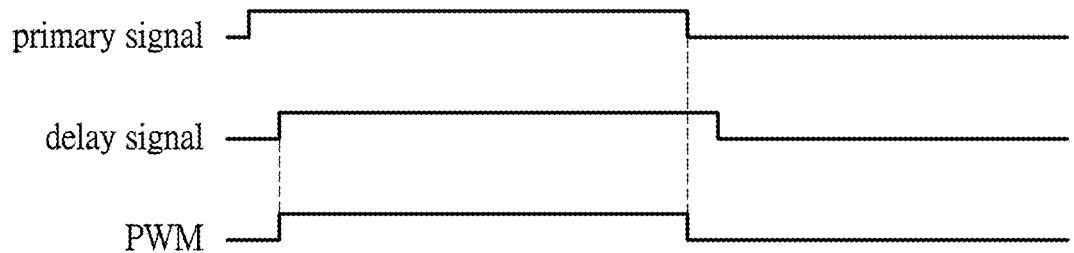
FIG. 4B shows exemplary waveforms of the primary signal, the delay signal and the PWM signal according to a second exemplary embodiment of the present invention.

FIG. 4B shows exemplary waveforms of the primary signal, the delay signal and the PWM signal according to a second exemplary embodiment of the present invention. In the embodiment, logical AND operation is performed on the primary signal (with the MSB value plus 1, that is, a derivative of the MSB value) and the delay signal (with the LSB value). Therefore, the PWM signal turns on at a leading edge of the delay signal, and turns off at a trailing edge of the primary signal.

Figure 4C:
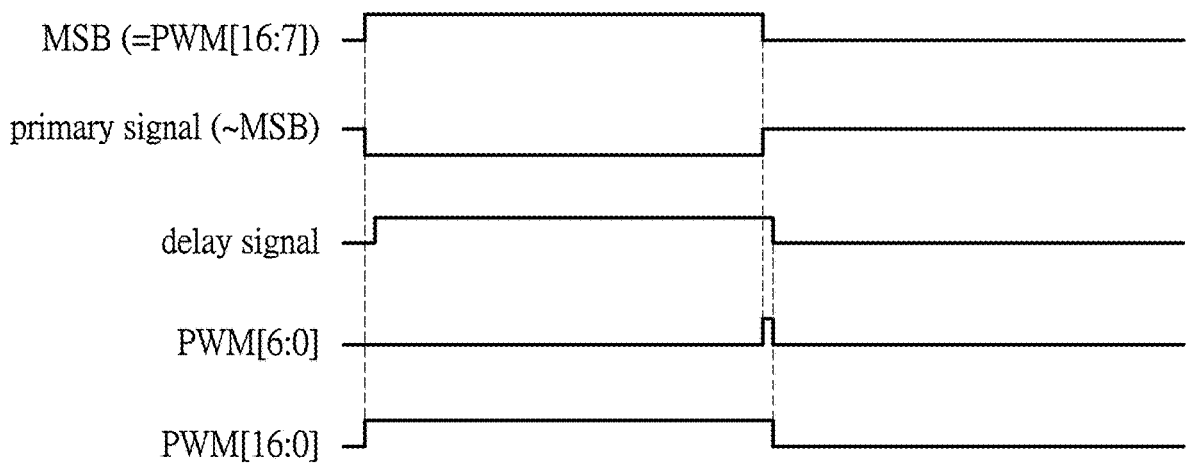
FIG. 4C shows exemplary waveforms of the primary signal, the delay signal and the PWM signal according to a third exemplary embodiment of the present invention.

FIG. 4C shows exemplary waveforms of the primary signal, the delay signal and the PWM signal according to a third exemplary embodiment of the present invention. In the embodiment, logical AND operation is performed on the primary signal (with an inversed MSB value, that is, a derivative of the MSB value) and the delay signal (with the LSB value). Accordingly, lower bits of the PWM signal (e.g., PWM[6:0]) may be generated. The lower bits of the PWM signal (e.g., PWM[6:0]) is then added to higher bits of the PWM signal (e.g., MSB value) to obtain the PWM signal, that is, PWM[16:0]=PWM[16:7]+PWM[6:0].

Although logical OR and logical AND operations are exemplified above, it is appreciated that other logical operations (e.g., NAND, NOR, XOR, XNOR) may be adopted instead in other embodiments.

Although specific embodiments have been illustrated and described, it will be appreciated by those skilled in the art that various modifications may be made without departing from the scope of the present invention, which is intended to be limited solely by the appended claims.

What is claimed is:

1. A pulse-width modulation (PWM) circuit, comprising:
    a partition circuit coupled to receive a PWM value representing a duty cycle of a PWM signal to be generated, and configured to accordingly generate a most-significant-bits (MSB) value representing higher-order bits of the PWM value and a least-significant-bits (LSB) value representing lower-order bits of the PWM value;
    a PWM generator coupled to receive the MSB value or a derivative thereof, and configured to accordingly generate a primary signal with a duty cycle corresponding to the MSB value;
    a delay circuit that generates a delay signal representing the primary signal with delay time determined according to the LSB value or a derivative thereof; and
    a combine circuit that generates the PWM signal according to the primary signal and the delay signal, by performing a logical operation on the primary signal and the delay signal.

2. The PWM circuit of claim 1, wherein the PWM generator comprises:
    a counter that increments periodically;
    a compare circuit that compares a count value of the counter with the MSB value; and
    a pulse generator that generates a pulse when the counter starts counting responding to a reset signal, the generated pulse being held high until the count value is greater than the MSB value, thereby generating the primary signal.

3. The PWM circuit of claim 1, wherein the delay circuit comprises:
    a plurality of delay gates connected in series; and
    a plurality of multiplexers;
    wherein one of an input and an output of each delay gate is selected by a corresponding multiplexer according to a corresponding LSB bit.

4. The PWM circuit of claim 3, wherein the output of the delay gate is selected when the corresponding LSB bit is "1," otherwise the input of the delay gate is selected.

5. The PWM circuit of claim 3, wherein the input of the delay gate is selected when the corresponding LSB bit is "1," otherwise the output of the delay gate is selected.

6. The PWM circuit of claim 1, wherein the delay circuit comprises:
    a plurality of capacitors with different capacitance connected in parallel, which are controllably connected to earth respectively.

7. The PWM circuit of claim 1, wherein the combine circuit performs logical OR operation on the primary signal with the MSB value and the delay signal with the LSB value, thereby the PWM signal turning on at a leading edge of the primary signal, and turning off at a trailing edge of the delay signal.

8. The PWM circuit of claim 1, wherein the combine circuit performs logical AND operation on the primary signal with the MSB value plus 1 and the delay signal with the LSB value, thereby the PWM signal turning on at a leading edge of the delay signal, and turning off at a trailing edge of the primary signal.

9. The PWM circuit of claim 1, wherein the combine circuit performs logical AND operation on the primary signal with an inversed MSB value and the delay signal with the LSB value, thereby generating lower bits of the PWM signal, which is added to the MSB value to obtain the PWM signal.

10. The PWM circuit of claim 1, wherein the combine circuit performs logical operation OR, AND, NAND, NOR, XOR or XNOR on the primary signal and the delay signal.

* * * * *